US009035423B1

(12) United States Patent
Tsukahara et al.

(10) Patent No.: US 9,035,423 B1
(45) Date of Patent: May 19, 2015

(54) SEMICONDUCTOR DEVICE WITH INDUCTOR HAVING INTERLEAVED WINDINGS FOR CONTROLLING CAPACITANCE (71) Applicant: Mitsubishi Electric Corporation, Tokyo (JP)

(72) Inventors: Yoshihiro Tsukahara, Tokyo (JP); Takao Ishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/463,841

(22) Filed: Aug. 20, 2014

(30) Foreign Application Priority Data

Dec. 25, 2013 (JP) ................................. 2013-267685

(51) Int. Cl.
*H01F 27/28* (2006.01)
*H01F 27/32* (2006.01)
*H01L 49/02* (2006.01)
H01F 38/04 (2006.01)
H01F 5/00 (2006.01)
H01F 17/00 (2006.01)

(52) U.S. Cl.
CPC ............ *H01L 28/10* (2013.01); *H01F 27/2804* (2013.01); *H01F 5/003* (2013.01); *H01F 17/0013* (2013.01)

(58) Field of Classification Search
CPC . H01F 27/28; H01F 27/2804; H01F 27/2809; H01F 27/2819; H01F 5/003; H01F 17/0013; H01F 17/0006
See application file for complete search history.

(56) References Cited

U.S. PATENT DOCUMENTS

| 4,959,631 | A | * | 9/1990 | Hasegawa et al. | 336/83 |
| 5,095,357 | A | * | 3/1992 | Andoh et al. | 257/379 |
| 5,548,265 | A | * | 8/1996 | Saito | 336/200 |
| 5,572,179 | A | * | 11/1996 | Ito et al. | 336/200 |
| 5,781,071 | A | * | 7/1998 | Kusunoki | 330/269 |
| 5,966,063 | A | * | 10/1999 | Sato et al. | 336/200 |
| 6,420,773 | B1 | * | 7/2002 | Liou | 257/531 |
| 6,429,504 | B1 | * | 8/2002 | Beaussart et al. | 257/531 |
| 6,476,704 | B2 | * | 11/2002 | Goff | 336/200 |
| 6,838,970 | B2 | * | 1/2005 | Basteres et al. | 336/200 |

(Continued)

FOREIGN PATENT DOCUMENTS

JP  11-154730 A  6/1999
JP  2003-78017 A  3/2003

(Continued)

*Primary Examiner* — Laura Menz
*Assistant Examiner* — Maliheh Malek
(74) *Attorney, Agent, or Firm* — Leydig, Voit & Mayer, Ltd.

(57) ABSTRACT

A first spiral inductor is provided on the semiconductor substrate. A dielectric film covers the first spiral inductor. A second spiral inductor is provided on the dielectric film. A connecting portion penetrates the dielectric film and electrically connects a first inner end portion of the first spiral inductor to a second inner end portion of the second spiral inductor. Winding direction of the first spiral inductor from a first outer end portion toward the first inner end portion is the same as the winding direction of the second spiral inductor from a second inner end portion toward the second outer end portion. A wire of the second spiral inductor is disposed opposite the first spiral inductor with the dielectric film between them. The wire of the second spiral inductor is disposed in gaps between windings of the first spiral inductor, when viewed in a plan view.

9 Claims, 6 Drawing Sheets (56) References Cited

U.S. PATENT DOCUMENTS

| | | | |
|---|---|---|---|
| 6,867,677 B2* | 3/2005 | Nielson | 336/200 |
| 6,922,128 B2* | 7/2005 | Vilander et al. | 336/200 |
| 6,972,658 B1* | 12/2005 | Findley et al. | 336/200 |
| 7,095,307 B1* | 8/2006 | Barrett et al. | 336/200 |
| 7,307,503 B2* | 12/2007 | Kaji et al. | 336/200 |
| 7,504,923 B1* | 3/2009 | Lin et al. | 336/200 |
| 7,525,407 B2* | 4/2009 | Lee et al. | 336/200 |
| 7,598,838 B2* | 10/2009 | Hargrove et al. | 336/200 |
| 7,705,704 B2* | 4/2010 | Lee et al. | 336/200 |
| 7,924,135 B2* | 4/2011 | Chen et al. | 336/232 |
| 8,219,060 B2* | 7/2012 | Bhagat et al. | 455/333 |
| 8,581,684 B2* | 11/2013 | Noire et al. | 336/200 |
| 8,610,246 B2* | 12/2013 | Yoshihara et al. | 257/531 |
| 8,704,627 B2* | 4/2014 | Kuroda | 336/200 |
| 8,928,451 B2* | 1/2015 | Sim et al. | 336/200 |
| 2001/0028098 A1* | 10/2001 | Liou | 257/531 |
| 2002/0017672 A1* | 2/2002 | Ker et al. | 257/303 |
| 2003/0127704 A1* | 7/2003 | Kobayashi et al. | 257/531 |
| 2003/0184408 A1* | 10/2003 | Goyette et al. | 333/118 |
| 2004/0017278 A1* | 1/2004 | Castaneda et al. | 336/200 |
| 2004/0140878 A1* | 7/2004 | Heima | 336/223 |
| 2005/0073025 A1* | 4/2005 | Hashizume et al. | 257/531 |
| 2006/0151851 A1* | 7/2006 | Pillai et al. | 257/531 |
| 2006/0170072 A1* | 8/2006 | Nakashiba | 257/531 |
| 2006/0181386 A1* | 8/2006 | Lee et al. | 336/200 |
| 2007/0108551 A1* | 5/2007 | Lin | 257/531 |
| 2010/0295648 A1* | 11/2010 | Huang et al. | 336/200 |
| 2012/0025366 A1* | 2/2012 | Kanaya et al. | 257/693 |
| 2012/0044034 A1* | 2/2012 | Nazarian et al. | 336/200 |
| 2012/0050130 A1* | 3/2012 | Nishioka et al. | 343/867 |
| 2013/0293336 A1* | 11/2013 | Lo et al. | 336/200 |
| 2015/0061813 A1* | 3/2015 | Kim et al. | 336/200 |

FOREIGN PATENT DOCUMENTS

| | | |
|---|---|---|
| JP | 2007-318362 A | 12/2007 |
| JP | 2013-153011 A | 8/2013 |

* cited by examiner

SEMICONDUCTOR DEVICE WITH INDUCTOR HAVING INTERLEAVED WINDINGS FOR CONTROLLING CAPACITANCE

BACKGROUND OF THE INVENTION

1. Field of the Invention

The present invention relates to a high-frequency device mainly used for a high-frequency band radio device or high-frequency band radar device or the like, and more particularly, to a semiconductor device provided with a spiral inductor on a semiconductor substrate.

2. Background Art

In recent years, mobile communication devices typified by portable terminals or the like are required to realize a size reduction, multiple functions and a cost reduction, and high-frequency devices mounted thereon are also required to realize a size reduction, multiple functions and a cost reduction. For such high-frequency devices, an MMIC (Monolithic Microwave Integrated Circuit) is often used in which an active element such as a transistor and a matching circuit are integrally formed on a semi-insulating substrate such as GaAs, SiGe or Si.

A matching circuit is configured of passive elements such as resistor, MIM capacitor, and spiral inductor. The MIM capacitor is made up of an upper layer metal and a lower layer metal of a dielectric film. The spiral inductor is a spiral wire. Since the spiral inductor occupies a greater area than other passive circuits in a matching circuit formed on a semiconductor substrate in particular, the spiral inductor is required to realize a size reduction.

In order to obtain a greater inductance with a small area, a structure is disclosed in which two spiral inductors wound in the same direction are laminated and one spiral inductor is disposed at a position facing a gap with the other (e.g., see Japanese Patent Application Laid-Open No. 2003-78017 (page 5, FIG. 1), Japanese Patent Application Laid-Open No. 2013-153011 (page 6, FIG. 1), Japanese Patent Application Laid-Open No. 11-154730 (page 8, FIG. 1)).

Moreover, as for portable terminals, a same terminal often uses different frequency bands. Therefore, such a terminal needs to use a filter to remove signals in other frequency bands, and requires a matching circuit that forms this filter (e.g., see Japanese Patent Application Laid-Open No. 2007-318362 (page 12, FIG. 2)).

SUMMARY OF THE INVENTION

According to Japanese Patent Application Laid-Open No. 2003-78017 (page 5, FIG. 1), Japanese Patent Application Laid-Open No. 2013-153011 (page 6, FIG. 1), Japanese Patent Application Laid-Open No. 11-154730 (page 8, FIG. 1), two spiral inductors are arranged so as not to face each other, thus reducing a coupling capacitance between the two. For this reason, a self-resonance (cutoff) frequency (a frequency at which an inductive-to-capacitative change takes place) is high and a high inductance value is obtained in constituting the matching circuit, and therefore such a configuration is advantageous for matching within a band. However, this configuration is unsuitable for rejecting bands other than a desired band, a band on a high-frequency band side in particular, and it is therefore necessary to provide an additional filter circuit that rejects bands outside this band. In addition, configuring a spiral inductor on a semiconductor substrate as a filter circuit to reject unnecessary bands may cause the size of the MMIC to increase. Furthermore, the prior art described in Japanese Patent Application Laid-Open No. 11-154730 (page 8, FIG. 1) requires a wiring which constitutes a connection line from an inner end portion of the spiral inductor to an external circuit, leading to an increase in the number of manufacturing steps.

In view of the above-described problems, an object of the present invention is to provide a semiconductor device which can change frequency characteristics of gains without changing the number of turns and occupation area of the spiral inductors.

According to the present invention, a semiconductor device includes: a semiconductor substrate; a first spiral inductor on the semiconductor substrate and being a spiral wire having a first inner end portion and a first outer end portion; a dielectric film covering the first spiral inductor; a second spiral inductor on the dielectric film and being a spiral wire having a second inner end portion and a second outer end portion; and a connecting portion penetrating the dielectric film and electrically connecting the first inner end portion to the second inner end portion, wherein a rotation direction of the first spiral inductor from the first outer end portion toward the first inner end portion is same as a rotation direction of the second spiral inductor from the second inner end portion toward the second outer end portion, the first spiral inductor includes a first adjusting wire, the second spiral inductor includes a second adjusting wire parallel to the first adjusting wire, the second adjusting wire is disposed above the first adjusting wire via the dielectric film, and in parts other than the first and second adjusting wires, a wire of the second spiral inductor is disposed in a gap between wires of the first spiral inductor in a plan view.

The present invention changes the number of superimposing linear wires of the two spiral inductors, and can thereby change frequency characteristics of gains without changing the number of turns and occupation area of the spiral inductors.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
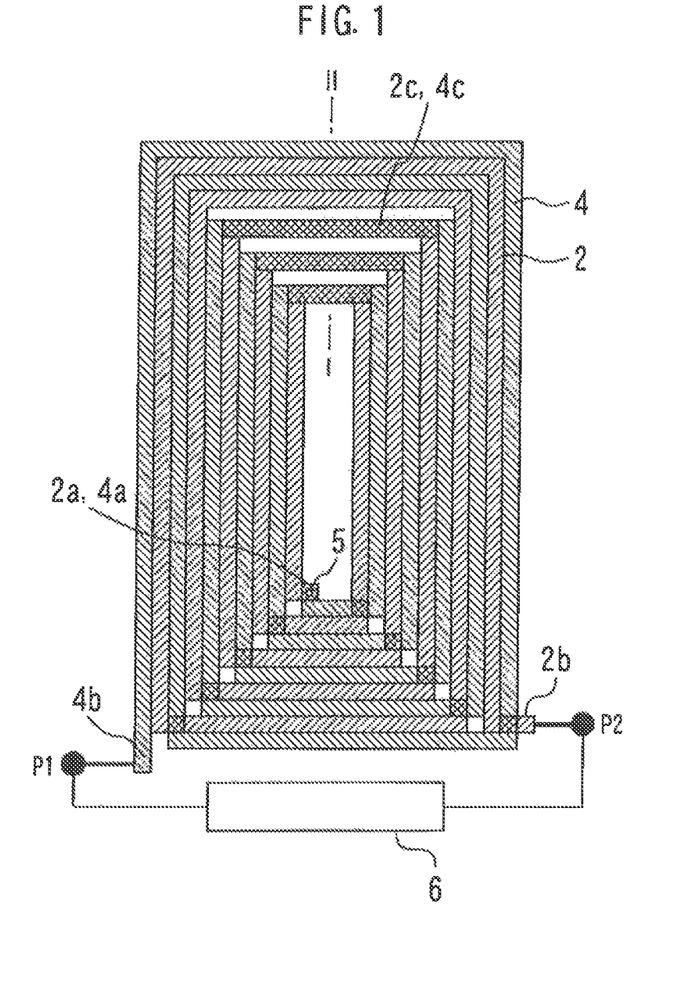
FIG. 1 is a top view illustrating a semiconductor device according to a first embodiment of the present invention.
Figure 2:
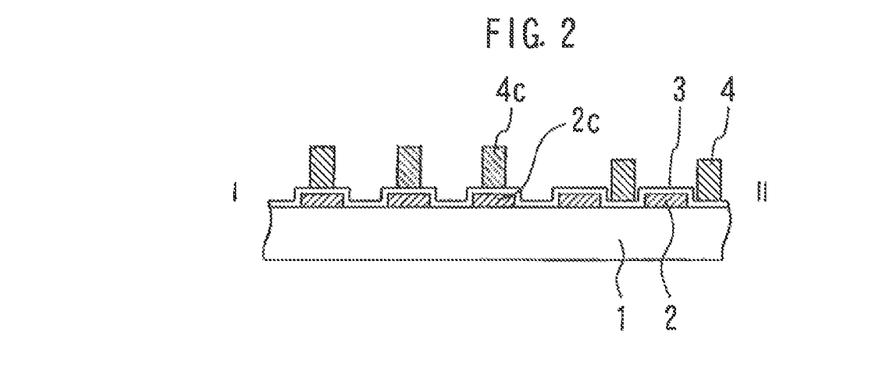
FIG. 2 is a cross-sectional view along a line I-II in FIG. 1.

FIG. 1 is a top view illustrating a semiconductor device according to a first embodiment of the present invention. FIG. 2 is a cross-sectional view along a line I-II in FIG. 1. A semiconductor substrate 1 is a GaAs substrate, Si substrate, SiGe substrate, GaN on SiC substrate or GaN on Si substrate or the like.

A spiral inductor 2 which is a spiral metal wire including an inner end portion 2a and an outer end portion 2b is provided on this semiconductor substrate 1. A dielectric film 3 made of SiN or SiON covers the spiral inductor 2. A spiral inductor 4 which is a spiral metal wire including an inner end portion 4a and an outer end portion 4b is provided on the dielectric film 3. The spiral inductors 2 and 4 are a plurality of linear wires arranged in a spiral form.

A contact hole 5 penetrates the dielectric film 3 and electrically connects the inner end portion 2a and the inner end portion 4a. The outer end portion 2b and the outer end portion 4b are an input terminal and an output terminal of an inductor made up of the spiral inductors 2 and 4.

A semiconductor circuit 6 is provided on the semiconductor substrate 1. The semiconductor circuit 6 is connected to at least one of the outer end portion 2b and the outer end portion 4b. The semiconductor circuit 6 includes transistors such as field-effect transistors or hetero-bipolar transistors, resistors, capacitors or the like.

The rotation direction of the spiral inductor 2 from the outer end portion 2b toward the inner end portion 2a is the same as the rotation direction of the spiral inductor 4 from the inner end portion 4a toward the outer end portion 4b.

The spiral inductor 2 has a linear wire 2c. The spiral inductor 4 has a linear wire 4c parallel to the linear wire 2c. The linear wire 4c is disposed above the linear wire 2c via the dielectric film 3. In parts other than the linear wires 2c and 4c, the wire of the spiral inductor 4 is disposed in a gap between wires of the spiral inductor 2 in a plan view. That is, the wires of the spiral inductors 2 and 4 are arranged alternately. The wiring width of the spiral inductor 4 is equal to or smaller than the wiring interval of the spiral inductor 2.

Figure 3:
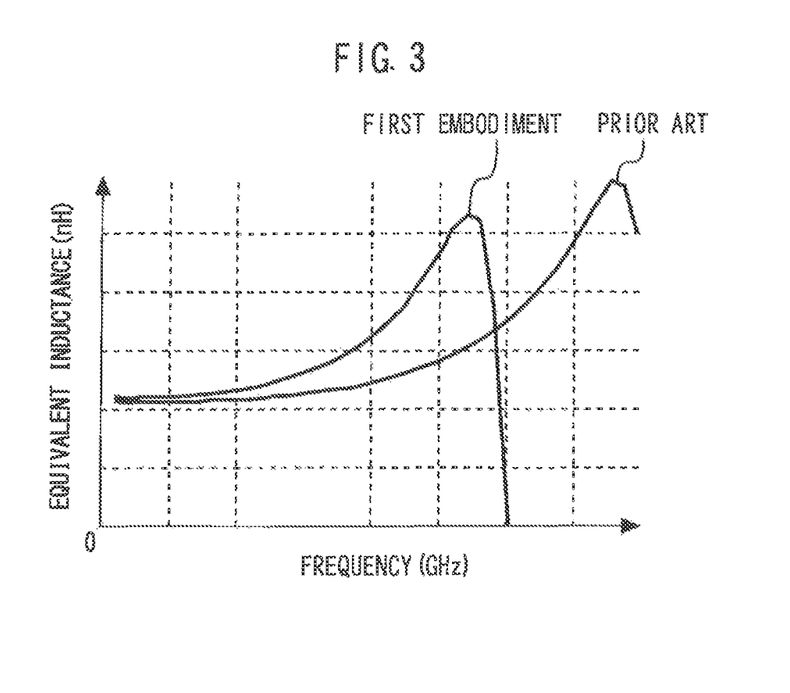
FIG. 3 is a diagram illustrating a comparison of frequency characteristics between the spiral inductor of the first embodiment and that of a prior art.

FIG. 3 is a diagram illustrating a comparison of frequency characteristics between the spiral inductor of the first embodiment and that of a prior art. In the prior art, mutually parallel linear wires of the two spiral inductors do not overlap. In contrast, in the first embodiment, parts of the mutually parallel linear wires of the two spiral inductors are superimposed on one another via the dielectric film, and it is thereby possible to increase the coupling capacitance between the two and shift the cutoff frequency to a lower frequency. The linear wires 2c and 4c act as wires for adjusting the coupling capacitance.

Figure 4:
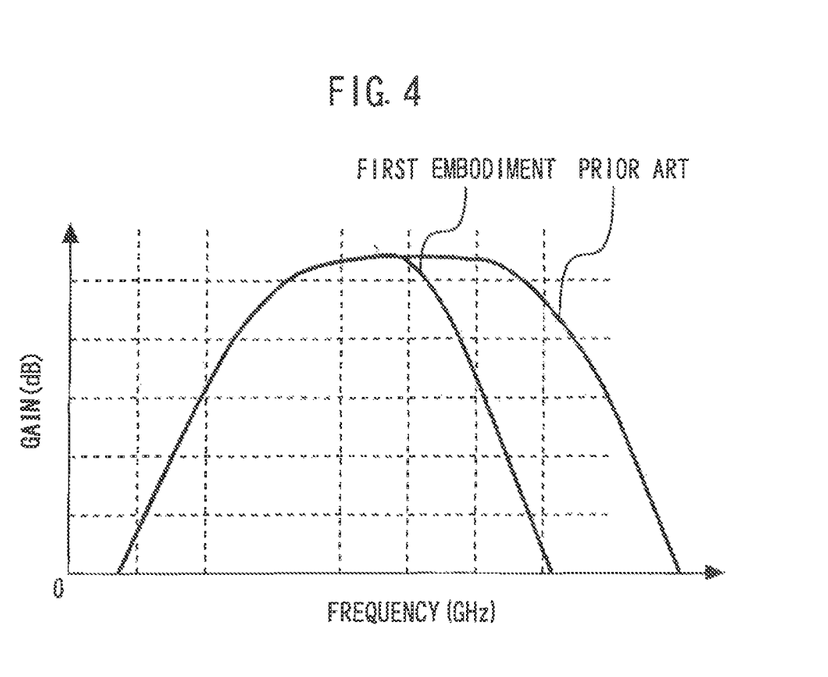
FIG. 4 is a diagram illustrating a comparison of characteristics between an amplifier using the spiral inductors of the first embodiment as a matching circuit and that of the prior art.

FIG. 4 is a diagram illustrating a comparison of characteristics between an amplifier using the spiral inductors of the first embodiment as a matching circuit and that of the prior art.

In the first embodiment, by superimposing parts of the mutually parallel linear wires of the two spiral inductors via the dielectric film, it is possible to change the frequency characteristic of gains. For this reason, it is possible to easily obtain a desired characteristic without separately providing any filter circuit that removes gains outside the band (high-frequency band side).

The present embodiment changes the number of superimposing linear wires of the two spiral inductors, and can thereby change frequency characteristics of gains without changing the number of turns and occupation area of the spiral inductors.

The spiral inductor according to the present embodiment may be used as a matching circuit of an MMIC (Monolithic Microwave Integrated Circuit) using a field-effect transistor or hetero-bipolar transistor formed on the same substrate. Using the spiral inductor according to the present embodiment for not only an amplifier but also for an MMIC having other functions provides similar effects.

Second Embodiment

Figure 5:
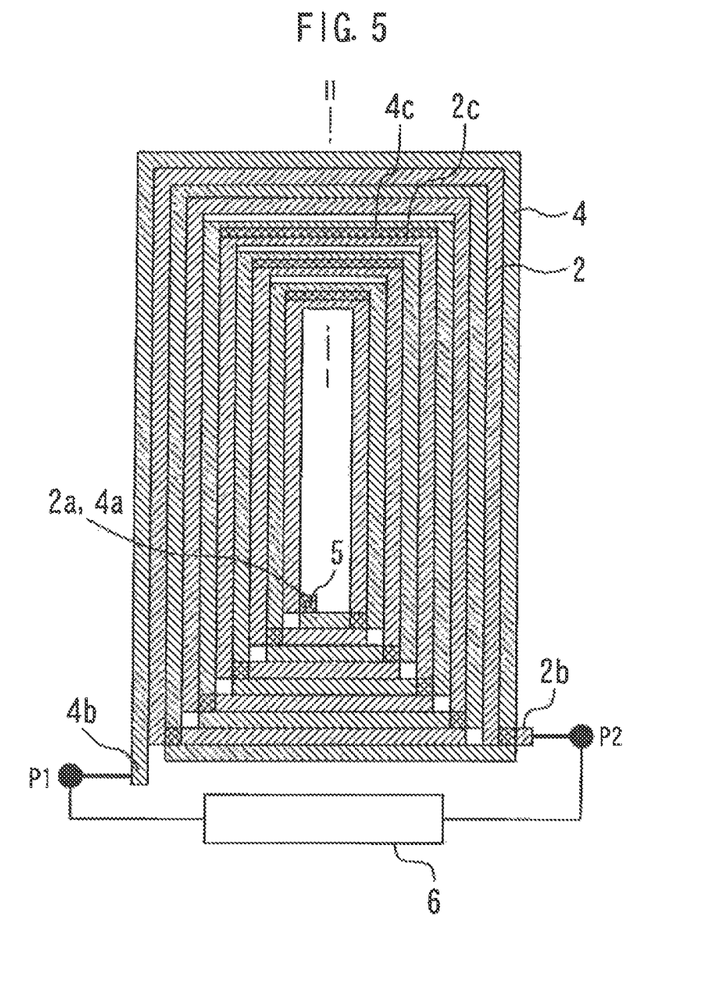
FIG. 5 is a top view illustrating a semiconductor device according to a second embodiment of the present invention.
Figure 6:
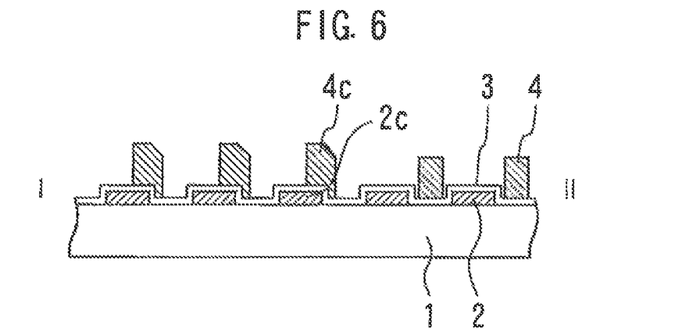
FIG. 6 is a cross-sectional view along a line I-II in FIG. 5. the inductance value.

FIG. 5 is a top view illustrating a semiconductor device according to a second embodiment of the present invention. FIG. 6 is a cross-sectional view along a line I-II in FIG. 5. A linear wire 4c is disposed so as to straddle above a linear wire 2c and a gap between wires of the spiral inductor 2. As in the case of the first embodiment, it is possible to reduce a coupling capacitance between wires rather than disposing the linear wire 4c above the linear wire 2c. Therefore, it is easier to perform fine adjustment of the cutoff frequency and it is possible to easily correct the inductance value.

Figure 7:
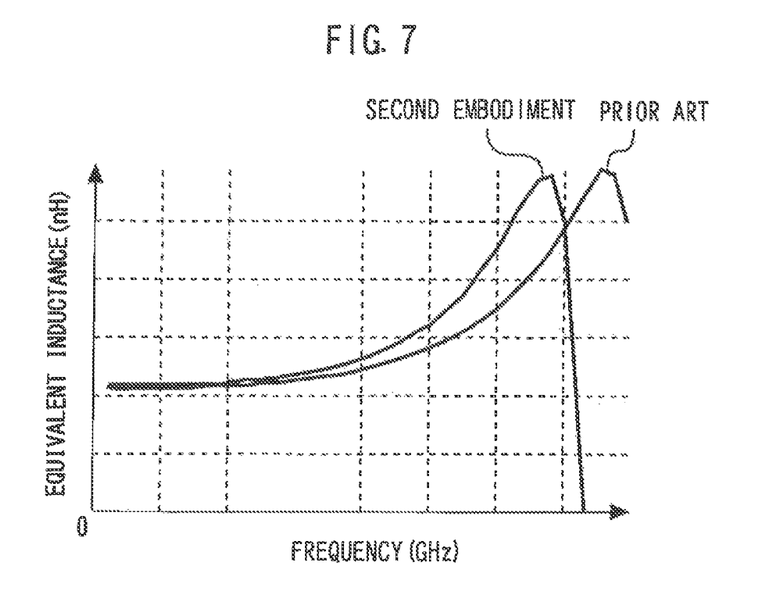
FIG. 7 is a diagram illustrating a comparison of frequency characteristics between a spiral inductor of the second embodiment and that of a prior art.
Figure 8:
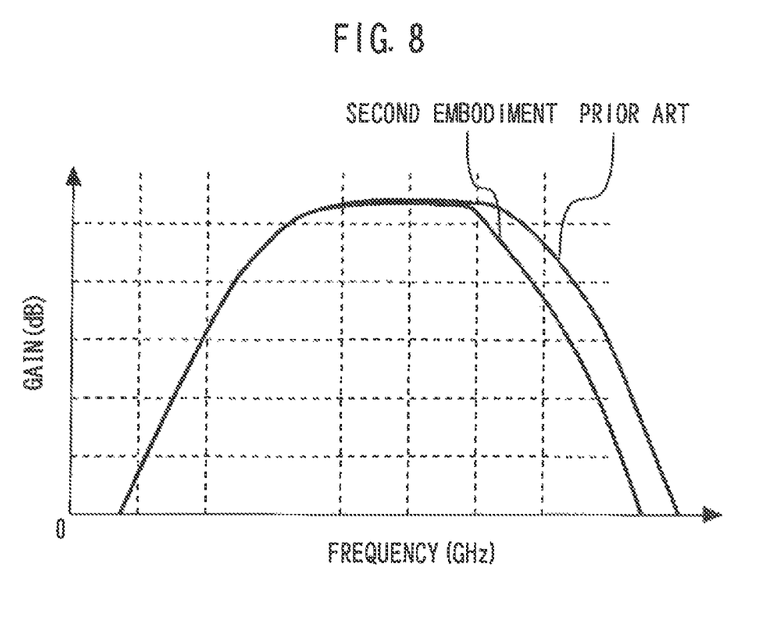
FIG. 8 is a diagram illustrating a comparison of characteristics between an amplifier using the spiral inductor of the second embodiment as a matching circuit and that of the prior art.

FIG. 7 is a diagram illustrating a comparison of frequency characteristics between a spiral inductor of the second embodiment and that of a prior art. FIG. 8 is a diagram illustrating a comparison of characteristics between an amplifier using the spiral inductor of the second embodiment as a matching circuit and that of the prior art.

The present embodiment changes the mode of superimposing linear wires of two spiral inductors, and can thereby change a frequency characteristic of gain without changing the number of turns and occupation area of the spiral inductors. Therefore, it is possible to adjust characteristic fluctuations caused by manufacturing variations, for example, of a transistor.

Third Embodiment

Figure 9:
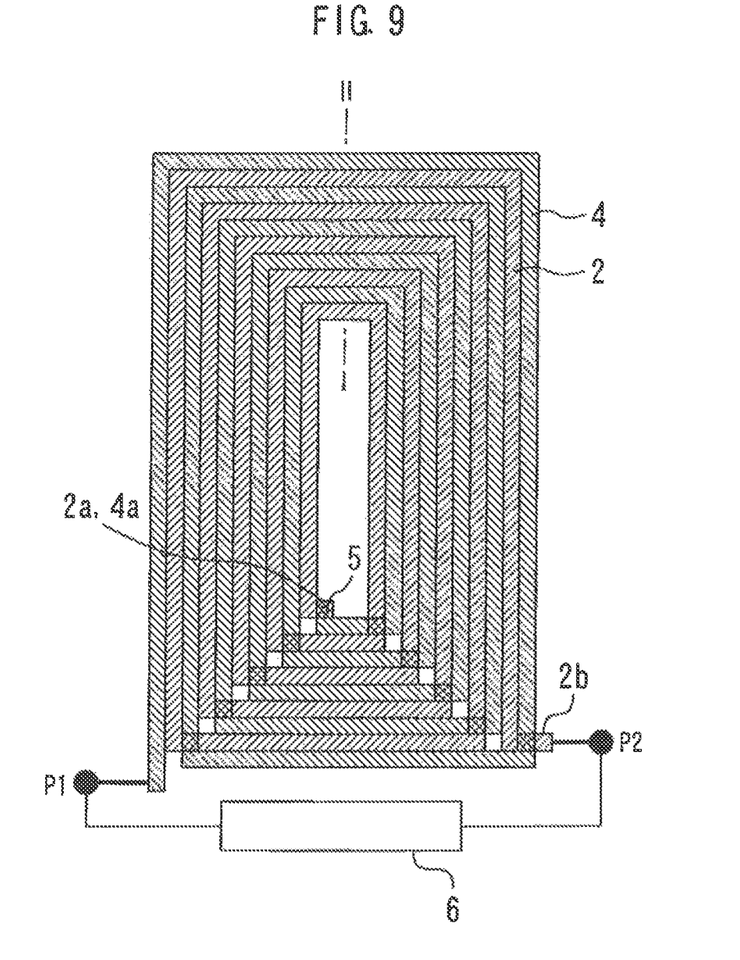
FIG. 9 is a top view illustrating a semiconductor device according to a third embodiment of the present invention.
Figure 10:
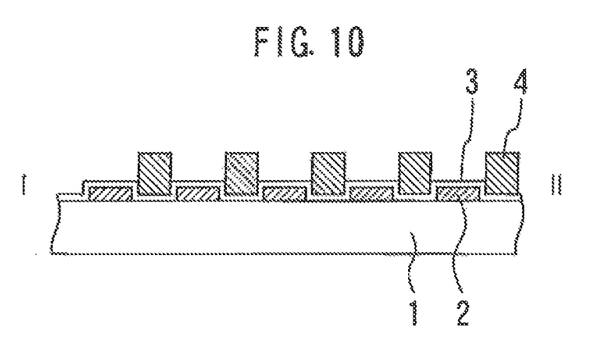
FIG. 10 is a cross-sectional view along a line I-II in FIG. 9.

FIG. 9 is a top view illustrating a semiconductor device according to a third embodiment of the present invention. FIG. 10 is a cross-sectional view along a line I-II in FIG. 9. In a plan view, a wire of a spiral inductor 4 is disposed in a gap between wires of a spiral inductor 2. A sidewall of the wire of the spiral inductor 4 faces a sidewall of the wire of the spiral inductor 2 via a dielectric film 3.

In a process of forming the spiral inductor 4, the opening width of a resist is widened by changing a cure temperature or the like. The wiring width of the spiral inductor 4 is thereby widened and the spiral inductor 4 is placed close to the sidewall of the wire of the spiral inductor 2 via a dielectric film.

Figure 11:
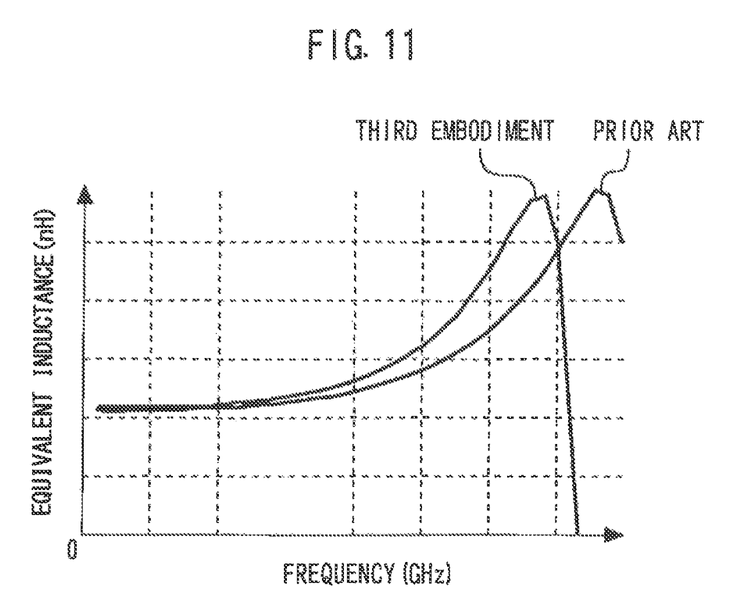
FIG. 11 is a diagram illustrating a comparison of frequency characteristics between the spiral inductor of the third embodiment and that of a prior art.

FIG. 11 is a diagram illustrating a comparison of frequency characteristics between the spiral inductor of the third embodiment and that of a prior art. The third embodiment can reduce the coupling capacitance between wires compared to that of the first embodiment, and thereby facilitates fine adjustment of the cutoff frequency and correction of an inductance value. This allows the cutoff frequency of the spiral inductor to be easily changed without changing a mask pattern for forming the spiral inductor 4, and can thereby achieve a cost reduction.

An example of a spiral inductor has been presented above where a plurality of linear wires are arranged in a spiral form, but the overall shape of the spiral inductor may be also circular, ellipsoidal or any given shape. In this case, the adjustment wire may be the same curved shape as other parts or only this part may be linear.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-267685, filed on Dec. 25, 2013, including specification, claims, drawings, and summary, on which the Convention priority of the present application is based, is incorporated herein by reference in its entirety.

What is claimed is:

1. A semiconductor device comprising:
a semiconductor substrate;
a first inductor on the semiconductor substrate and including a plurality of spirally-arranged windings of a first metal conductor, wherein adjacent windings of the first metal conductor of the first inductor are mutually spaced apart and are wound from an outside winding of the first inductor, located at a periphery of the first inductor, to an inside winding of the first inductor, located within the spirally-arranged windings of the first inductor, and including a first outer end connected to the outside winding of the first inductor and located at the periphery of the first inductor, and a first inner end connected to the inside winding of the first inductor and located within the first inductor;
a dielectric film covering the first inductor;
a second inductor on the dielectric film and including a plurality of spirally-arranged windings of a second metal conductor, wherein adjacent windings of the second metal conductor are mutually spaced apart and are wound from an outside winding of the second inductor, located at a periphery of the second inductor, to an inside winding of the second inductor, located within the spirally-arranged windings of the second inductor, and including a second outer end connected to the outside winding of the second inductor and located at the periphery of the second inductor, and a second inner end connected to the inside winding of the second inductor and located within the second inductor; and
a connecting portion penetrating the dielectric film and electrically connecting the first inner end to the second inner end, wherein
winding direction of the first inductor, from the first outer end toward the first inner end, is the same as winding direction of the second inductor, from the second inner end toward the second outer end,
some of the spirally-arranged windings of the second inductor are located on the dielectric film directly opposite corresponding spirally-arranged windings of the first inductor, and
some of the spirally-arranged windings of the second inductor are located on the dielectric film opposite the gaps between adjacent windings of the first inductor, and between corresponding pairs of the spirally-arranged windings of the first inductor, whereby capacitance between the windings of the first and second inductors is controlled.

2. The semiconductor device according to claim 1, wherein the spirally-arranged windings of both the first and second inductors include a plurality of linear conductor portions.

3. The semiconductor device according to claim 1, further comprising a semiconductor circuit on the semiconductor substrate and connected to at least one of the first and second outer ends.

4. A semiconductor device comprising:
a semiconductor substrate;
a first inductor on the semiconductor substrate and including a plurality of spirally-arranged windings of a first metal conductor, wherein adjacent windings of the first metal conductor of the first inductor are mutually spaced apart and are wound from an outside winding of the first inductor, located at a periphery of the first inductor, to an inside winding of the first inductor, located within the spirally-arranged windings of the first inductor, and including a first outer end connected to the outside winding of the first inductor and located at the periphery of the first inductor, and a first inner end connected to the inside winding of the first inductor and located within the first inductor;
a dielectric film covering the first inductor;
a second inductor on the dielectric film and including a plurality of spirally-arranged windings of a second metal conductor, wherein adjacent windings of the second metal conductor are mutually spaced apart and are wound from an outside winding of the second inductor, located at a periphery of the second inductor, to an inside winding of the second inductor, located within the spirally-arranged windings of the second inductor, and including a second outer end connected to the outside winding of the second inductor and located at the periphery of the second inductor, and a second inner end connected to the inside winding of the second inductor and located within the second inductor; and
a connecting portion penetrating the dielectric film and electrically connecting the first inner end to the second inner end, wherein
winding direction of the first inductor, from the first outer end toward the first inner end, is the same as winding direction of the second inductor, from the second inner end toward the second outer end,
some of the spirally-arranged windings of the second inductor are located on the dielectric film, partially directly opposite corresponding spirally-arranged windings of the first inductor, and partially opposite the gaps between adjacent windings of the first inductor, and
some of the spirally-arranged windings of the second inductor are located on the dielectric film, in the gaps between adjacent windings of the first inductor, and between corresponding pairs of the spirally-arranged windings of the first inductor, whereby capacitance between the windings of the first and second inductors is controlled.

5. The semiconductor device according to claim 4, wherein the spirally-arranged windings of both the first and second inductors include a plurality of linear conductor portions.

6. The semiconductor device according to claim 4, further comprising a semiconductor circuit on the semiconductor substrate and connected to at least one of the first and second outer ends.

7. A semiconductor device comprising:
a semiconductor substrate;
a first inductor on the semiconductor substrate and including a plurality of spirally-arranged windings of a first metal conductor, wherein adjacent windings of the first metal conductor of the first inductor are mutually spaced apart and are wound from an outside winding of the first inductor, located at a periphery of the first inductor, to an inside winding of the first inductor, located within the spirally-arranged windings of the first inductor, and including a first outer end connected to the outside winding of the first inductor and located at the periphery of the first inductor, and a first inner end connected to the inside winding of the first inductor and located within the first inductor;

a dielectric film covering the first inductor;

a second inductor on the dielectric film and including a plurality of spirally-arranged windings of a second metal conductor, wherein adjacent windings of the second metal conductor are mutually spaced apart and are wound from an outside winding of the second inductor, located at a periphery of the second inductor, to an inside winding of the second inductor, located within the spirally-arranged windings of the second inductor, and including a second outer end connected to the outside winding of the second inductor and located at the periphery of the second inductor, and a second inner end connected to the inside winding of the second inductor and located within the second inductor; and a connecting portion penetrating the dielectric film and electrically connecting the first inner end to the second inner end, wherein winding direction of the first inductor, from the first outer end toward the first inner end, is the same as winding direction of the second inductor, from the second inner end toward the second outer end, and the spirally-arranged windings of the second inductor are located on the dielectric film, in the gaps between adjacent windings of the first inductor, and between corresponding pairs of the spirally-arranged windings of the first inductor, with sidewalls of the windings of the first inductor directly opposite corresponding sidewalls of the windings of the second inductor and separated by the dielectric film.

8. The semiconductor device according to claim 7, wherein the spirally-arranged windings of both the first and second inductors include a plurality of linear conductor portions.

9. The semiconductor device according to claim 7, further comprising a semiconductor circuit on the semiconductor substrate and connected to at least one of the first and second outer ends.

\* \* \* \* \*